United States Patent
Wu et al.

(10) Patent No.: US 10,121,684 B2
(45) Date of Patent: Nov. 6, 2018

(54) MANUFACTURING METHOD, PICKUP METHOD, EQUIPMENT AND EMI (ELECTROMAGNETIC INTERFERENCE) ELECTROMAGNETIC SHIELDING LAYER MANUFACTURING METHOD OF SIP (SYSTEM IN PACKAGE) MODULE

(71) Applicant: Universal Global Technology (Shanghai) Co., Ltd., Pudong New Area, Shanghai (CN)

(72) Inventors: Bin Wu, Shanghai (CN); Tsung-Yu Li, Shanghai (CN)

( * ) Notice: Subject to any disclaimer, the term of this patent is extended or adjusted under 35 U.S.C. 154(b) by 129 days.

(21) Appl. No.: 15/247,959

(22) Filed: Aug. 26, 2016

(65) Prior Publication Data

US 2017/0150607 A1    May 25, 2017

(30) Foreign Application Priority Data

Nov. 20, 2015   (CN) .......................... 2015 1 0808523

(51) Int. Cl.
| | | |
|---|---|---|
| H05K 3/34 | (2006.01) | |
| H01L 21/67 | (2006.01) | |
| H01L 23/552 | (2006.01) | |
| H05K 3/32 | (2006.01) | |

(52) U.S. Cl.
CPC ...... *H01L 21/67132* (2013.01); *H01L 23/552* (2013.01); *H05K 3/328* (2013.01); *H05K 2203/081* (2013.01); *H05K 2203/082* (2013.01); *Y10T 29/49144* (2015.01)

(58) Field of Classification Search
CPC ......... Y10T 29/53178; Y10T 29/53191; Y10T 29/4913; Y10T 29/53; Y10T 156/108; Y10T 156/1085; Y10T 156/1132; Y10T 29/49144; Y10T 29/49819
USPC .................. 29/840, 739, 740, 741, 743, 832
See application file for complete search history.

(56) References Cited

U.S. PATENT DOCUMENTS

| | | | | |
|---|---|---|---|---|
| 5,164,335 | A * | 11/1992 | Sato .................. | H01L 21/67011 264/272.15 |
| 7,364,616 | B2 * | 4/2008 | Tsuchiya .............. | B65H 3/0816 117/2 |
| 7,437,818 | B2 * | 10/2008 | Kabeshita ......... | H01L 21/67132 29/739 |

* cited by examiner

*Primary Examiner* — Thiem Phan
(74) *Attorney, Agent, or Firm* — Prakash Nama; Global IP Services, PLLC

(57) ABSTRACT

The invention discloses, pickup method, equipment and EMI electromagnetic shielding layer manufacturing method of SiP module. The method for picking up the SiP module comprises the following steps: A nozzle descends to touch the upper surface of the SiP module; the nozzle sucks the SiP module; an air thimble ascends to touch the lower surface of the carrier; the air thimble covers the through hole of the carrier, so as to form the enclosed space for the lower surface of the SiP module, the through hole and the air thimble; compressed air is sprayed into the enclosed space from the hollow structure of the air thimble and acts on the lower surface of the SiP module, so that the bonding between the SiP module and the doubled-sided adhesive tape is loosened; the nozzle ascends and picks up the SiP module.

18 Claims, 7 Drawing Sheets

MANUFACTURING METHOD, PICKUP METHOD, EQUIPMENT AND EMI (ELECTROMAGNETIC INTERFERENCE) ELECTROMAGNETIC SHIELDING LAYER MANUFACTURING METHOD OF SIP (SYSTEM IN PACKAGE) MODULE

BACKGROUND OF THE INVENTION

The invention relates to the manufacturing of an SIP module, particularly a manufacturing method, a pickup method, equipment and an EMI electromagnetic shielding layer manufacturing method of the SiP module.

With the development of science and technology, now electronic equipment becomes increasingly lighter, thinner and smaller. That requires high distribution density of circuit components and lines, many components are crowded in a very small space, which increases the chance of mutual interference of components. Wherein, EMI and noise are the most disturbing. In order to solve the above technical problems, technicians in the field invent an electromagnetic interference shielding structure of an integrated circuit substrate, directly form block compartments on the integrated circuit substrate by sputtering, so as to effectively prevent electromagnetic interference and noise.

SiP is mainly to integrate different components into a multifunctional substrate, so as to achieve the purpose of function integration. Different chip lining methods are matched with different internal bonding technologies, so that the packaging forms of SiP have diversified portfolios, and products can be customized or flexibly manufactured according to the needs of customers. In order not to spray the sputtering material onto one side of the SiP module with welding pads, the technicians in the field printing an INK protective layer on above welding pads before sputtering, then remove the INK protective layer after sputtering, and meanwhile remove the sputtering material which is sprayed onto the INK protective layer during sputtering. Although the method can protect the welding pads of the SiP module against polluted and damage, the method comprises a complicated operation process and low efficiency, and is not suitable for mass production.

Therefore, the Applicant is dedicated to provide the manufacturing method, the pickup method and the equipment of the SIP module as well as the EMI electromagnetic shielding layer manufacturing method, so as to obtain the SiP module are not polluted and which is not damaged, and improve the production efficiency of the SiP module.

BRIEF SUMMARY OF THE INVENTION

The purpose of the invention is to provide the manufacturing method, the pickup method and the equipment of the SiP module as well as the EMI electromagnetic shielding layer manufacturing method, so as to obtain the SiP module whose welding pads are not polluted and which is not damaged, and improve the production efficiency of the SIP module.

In order to solve the technical problems, the invention provides the pickup method of the SiP module. The method is used for picking up the SiP module which is fixed on the upper surface of a carrier by a doubled-sided adhesive tape, and comprises the following steps:

A nozzle descends to touch the upper surface of the SiP module;

The nozzle sucks the SiP module with suction;

An air thimble ascends to touch the lower surface of the carrier; the air thimble covers the through hole of the carrier, so as to form the enclosed space for the lower surface of the SiP module, the through hole and the air thimble;

Compressed air is sprayed into the enclosed space from the hollow structure of the air thimble and acts on the lower surface of the SiP module, so that the bonding between the SiP module and the doubled-sided adhesive tape is loosened;

The nozzle ascends and picks up the SiP module.

The pickup method of the SiP module sprays compressed air to the SiP module, so that the bonding between the SiP module and the doubled-sided adhesive tape is loosened, so as to effectively pick up the SiP module which is fixed on the carrier through the doubled-sided adhesive tape. In addition, the compressed air not only can blow off impurities on the lower surface of the SIP module and prevent the welding pads on the SiP module from being polluted, but also can effectively prevent the welding pads on the SiP module from being damaged.

Preferably, the pressure of the sprayed compressed air is higher than or equal to the bonding force of the doubled-sided adhesive tape.

Under the condition, the pickup method can achieve better pickup effect.

Preferably, the pressure of the sprayed compressed air is smaller than the bonding force of the doubled-sided adhesive tape, so as to make the rest bonding force between the SiP module and the doubled-sided adhesive tape which is loosened is smaller than the suction force of the nozzle. Wherein the rest bonding force means the bonding force between the SiP module and the doubled-sided adhesive tape after compressed air is sprayed into the enclosed space from the hollow structure of the air thimble and acts on the lower surface of the SiP module, Under the condition, the pickup method can achieve better pickup effect.

Preferably, the pickup method also comprises the following steps: the air thimble descends to be separated from the lower surface of the carrier.

The invention also provides the EMI electromagnetic shielding layer manufacturing method of the SiP module, and comprises the following steps:

The SiP module is fixedly arranged on the upper surface of the carrier with the through hole through the doubled-sided adhesive tape, the lower surface of the SiP module is a surface, which is provided with the welding pads, and the welding pads are right above the through hole and do not touch the doubled-sided adhesive tape;

Conductive material is sputtered around and on the upper surface of the SiP module to form an EMI electromagnetic shielding layer;

The nozzle descends to touch the upper surface of the SiP module, and sucks the SiP module;

The air thimble ascends to touch the lower surface of the carrier; the air thimble covers the through hole of the carrier, so as to form the enclosed space for the lower surface of the SiP module, the through hole and the air thimble;

Compressed air is sprayed into the enclosed space from the hollow structure of the air thimble and acts on the lower surface of the SiP module, so that the bonding between the SiP module and the doubled-sided adhesive tape is loosened;

The nozzle ascends to pick up the manufactured SiP module with EMI electromagnetic shielding layers on the upper surface and around and without pollution or damage on the lower surface.

Because the SiP module is fixedly arranged on the carrier through the doubled-sided adhesive tape, the space between the SiP module and the carrier is effectively filled by the doubled-sided adhesive tape, so as to prevent the sputtering material from being sprayed onto the welding pads of the SiP module when the EMI electromagnetic shielding layers are manufactured on the SiP module.

Preferably, the pressure of the sprayed compressed air is higher than or equal to the bonding force of the doubled-sided adhesive tape.

Preferably, the pressure of the sprayed compressed air is smaller than the bonding force of the doubled-sided adhesive tape, so as to make the rest bonding force between the SiP module and the doubled-sided adhesive tape which is loosened is smaller than the suction force of the nozzle. Wherein the rest bonding force means the bonding force between the SiP module and the doubled-sided adhesive tape after compressed air is sprayed into the enclosed space from the hollow structure of the air thimble and acts on the lower surface of the SiP module, Preferably, the EMI electromagnetic shielding layer manufacturing method of the SiP module also comprises the following steps: the air thimble descends to be separated from the lower surface of the carrier.

The invention also provides the manufacturing method of the SIP module, and the method comprises the following steps:

Chips, active components and passive components required for the SiP module are welded on the upper surface of a PCB (printed circuit board), welding pads are pre-reserved on the lower surface of the PCB, and the PCBA (printed circuit board assembly) of the SiP module is manufactured;

Molding compound is filled in the PCBA, so that the molding compound covers the chips, active components and passive components on the upper surface of the PCBA, the molding compound is solidified and the SiP module is manufactured;

The SiP module is fixedly arranged on the upper surface of the carrier with the through hole through the doubled-sided adhesive tape, the lower surface of the SiP module is a surface, which is provided with the welding pads, and the welding pads are right above the through hole and do not touch the doubled-sided adhesive tape;

Conductive material is sputtered around and on the upper surface of the SiP module to form an EMI electromagnetic shielding layer;

The nozzle descends to touch the upper surface of the SiP module, and sucks the SiP module;

The air thimble ascends to touch the lower surface of the carrier; the air thimble covers the through hole of the carrier, so as to form the enclosed space for the lower surface of the SiP module, the through hole and the air thimble;

Compressed air is sprayed into the enclosed space from the hollow structure of the air thimble and acts on the lower surface of the SiP module, so that the bonding between the SIP module and the doubled-sided adhesive tape is loosened;

The nozzle ascends to pick up the manufactured SiP module without pollution or damage on the lower surface.

Preferably, the pressure of the sprayed compressed air is higher than or equal to the bonding force of the doubled-sided adhesive tape.

Preferably, the pressure of the sprayed compressed air is smaller than the bonding force of the doubled-sided adhesive tape, so as to make the rest bonding force between the SiP module and the doubled-sided adhesive tape which is loosened is smaller than the suction force of the nozzle. Wherein the rest bonding force means the bonding force between the SiP module and the doubled-sided adhesive tape after compressed air is sprayed into the enclosed space from the hollow structure of the air thimble and acts on the lower surface of the SiP module, Preferably, the method also comprises the following step: the air thimble descends to be separated from the lower surface of the carrier.

Preferably, the PCB, the PCBA and the SiP module which is manufactured through the solidification of molding compound are respectively a strip PCB, a strip PCBA and a strip SiP module; the strip SiP module is cut into single unit of SiP module before conductive material sputtering.

The invention also provides the pickup equipment of the SiP module, which is used for picking up the SP module which is fixed on the upper surface of the carrier through the doubled-sided adhesive tape. The equipment comprises the nozzle, a robotic arm, the air thimble and an air thimble moving mechanism; the nozzle is arranged above the carrier and is used for having suction on the upper surface of the SiP module and picking up the SiP module; the robotic arm is connected with the nozzle and is used for moving the nozzle; the air thimble is arranged below the carrier and a hollow structure for the compressed air to pass through is arranged in the middle of the air thimble and is used for spraying the compressed air; the air thimble moving mechanism is connected with the air thimble and makes the air thimble right to the through hole of the carrier; the air thimble moving mechanism can also make the air thimble ascend and descend to touch and be separated from the lower surface of the carrier.

Wherein, when the air thimble is lifted by the air thimble moving mechanism to touch the lower surface of the carrier, the air thimble covers the through hole of the carrier, so as to form the enclosed space for the lower surface of the SiP module, the through hole and the air thimble; the compressed air is sprayed into the enclosed space from the hollow structure of the air thimble and acts on the lower surface of the SiP module, so that the bonding between the SiP module and the doubled-sided adhesive tape is loosened; the nozzle sucks, ascends and picks up the SiP module.

Preferably, the pickup equipment of the SiP module also comprises an electromagnetic valve and a cylinder; the cylinder is connected with the air thimble, and is used for supplying compressed air to the air thimble; the electromagnetic valve is arranged between the cylinder and the air thimble, and is used for controlling the cylinder to spray the compressed air.

Wherein, when the air thimble is lifted by the air thimble moving mechanism to touch the lower surface of the carrier, the air thimble covers the through hole of the carrier, so as to form the enclosed space for the lower surface of the SiP module, the through hole and the air thimble; the compressed air is sprayed into the enclosed space from the hollow structure of the air thimble and acts on the lower surface of the SIP module, so that the bonding between the SiP module and the doubled-sided adhesive tape is loosened; the nozzle sucks, ascends and picks up the SiP module.

Preferably, the pressure of the sprayed compressed air is higher than or equal to the bonding force of the doubled-sided adhesive tape.

Preferably, the pressure of the sprayed compressed air is smaller than the bonding force of the doubled-sided adhesive tape, so as to make the rest bonding force between the SiP module and the doubled-sided adhesive tape which is loosened is smaller than the suction force of the nozzle. Wherein the rest bonding force means the bonding force between the SiP module and the doubled-sided adhesive tape after compressed air is sprayed into the enclosed space from the hollow structure of the air thimble and acts on the lower surface of the SiP module, Preferably, the air thimble is provided with an O-shaped ring; when the air thimble ascends, the O-shaped ring touches the lower surface of the carrier.

Preferably, the shape and the size of the air thimble are enough to cover the through hole of the carrier means that the size of the O-shaped ring is equal to or bigger than that of the through hole and is enough to cover and seal the bottom of the through hole.

The pickup equipment of the SiP module also comprises the air thimble moving mechanism; the air thimble moving mechanism is connected with the air thimble and makes the air thimble right to the through hole of the carrier; the air thimble moving mechanism can also make the air thimble ascend and descend to touch and be separated from the lower surface of the carrier.

Wherein, when the air thimble is lifted by the air thimble moving mechanism to touch the lower surface of the carrier, the air thimble covers the through hole of the carrier, so as to form the enclosed space for the lower surface of the SiP module, the through hole and the air thimble; the compressed air is sprayed into the enclosed space from the hollow structure of the air thimble and acts on the lower surface of the SiP module, so that the bonding between the SiP module and the doubled-sided adhesive tape is loosened; the nozzle sucks, ascends and picks up the SiP module.

Preferably, the SiP module also comprises a carrier transmission mechanism, and the carrier transmission mechanism is connected with the carrier for moving the carrier.

In sum, the invention can achieve the following beneficial effect:

(1) The pickup method of the SiP module sprays the compressed air to the lower surface of the SiP module through the through hole of the carrier, so that the bonding between the SiP module and the doubled-sided adhesive tape is loosened and the SiP module is fully sucked by a suction nozzle, so as to effectively pick up the SiP module which is fixed on the carrier through the doubled-sided adhesive tape, and effectively prevent the welding pads on the lower surface of the SiP module from being polluted or damaged.

(2) The EMI electromagnetic shielding layer manufacturing method of the SiP module fixes one side of the SiP module with the welding pads onto the carrier through the doubled-sided adhesive tape before sputtering the SiP module, then sputters conductive material onto the SiP module to form the EMI electromagnetic shielding layer, the doubled-sided adhesive tape effectively fills the space between the SiP module and the carrier, so as to effectively prevent the sputtering material from being sprayed to the lower surface of the SiP module and causing pollution.

(3) The pickup equipment of the SiP module sprays the compressed air to the lower surface of the SiP module which is fixed by the doubled-sided adhesive tape through the air thimble, so that the SiP module is fully sucked by the suction nozzle, so as to effectively pick up the SiP module, and effectively prevent the welding pads on the SiP module from being polluted or damaged.

(4) The air thimble in the pickup equipment of the SiP module touches the lower surface of the carrier through the O-shaped ring, so that the touching of the air thimble and the lower surface of the carrier is tighter, so as to effectively prevent the compressed air from being leaked during the spraying process.

BRIEF DESCRIPTION OF THE DRAWINGS

Below is the further description of the invention by drawings and specific embodiments.

Figure 1:
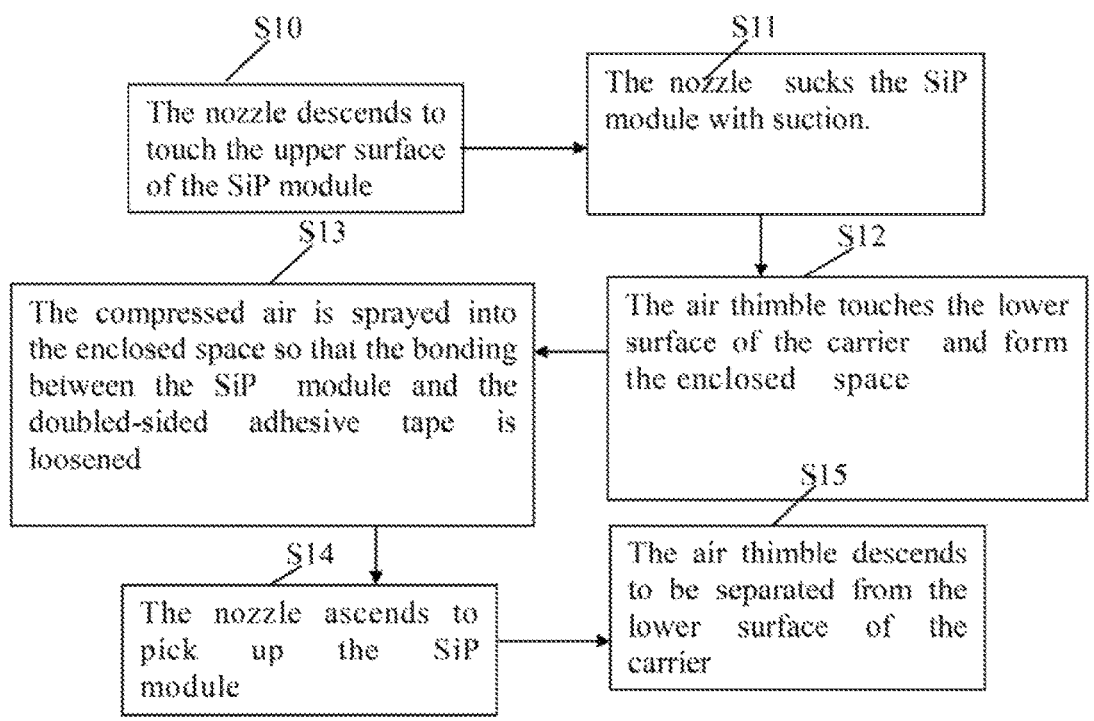
FIG. 1 is the flowchart for the pickup method of the SiP module in the specific embodiment.
Figure 2:
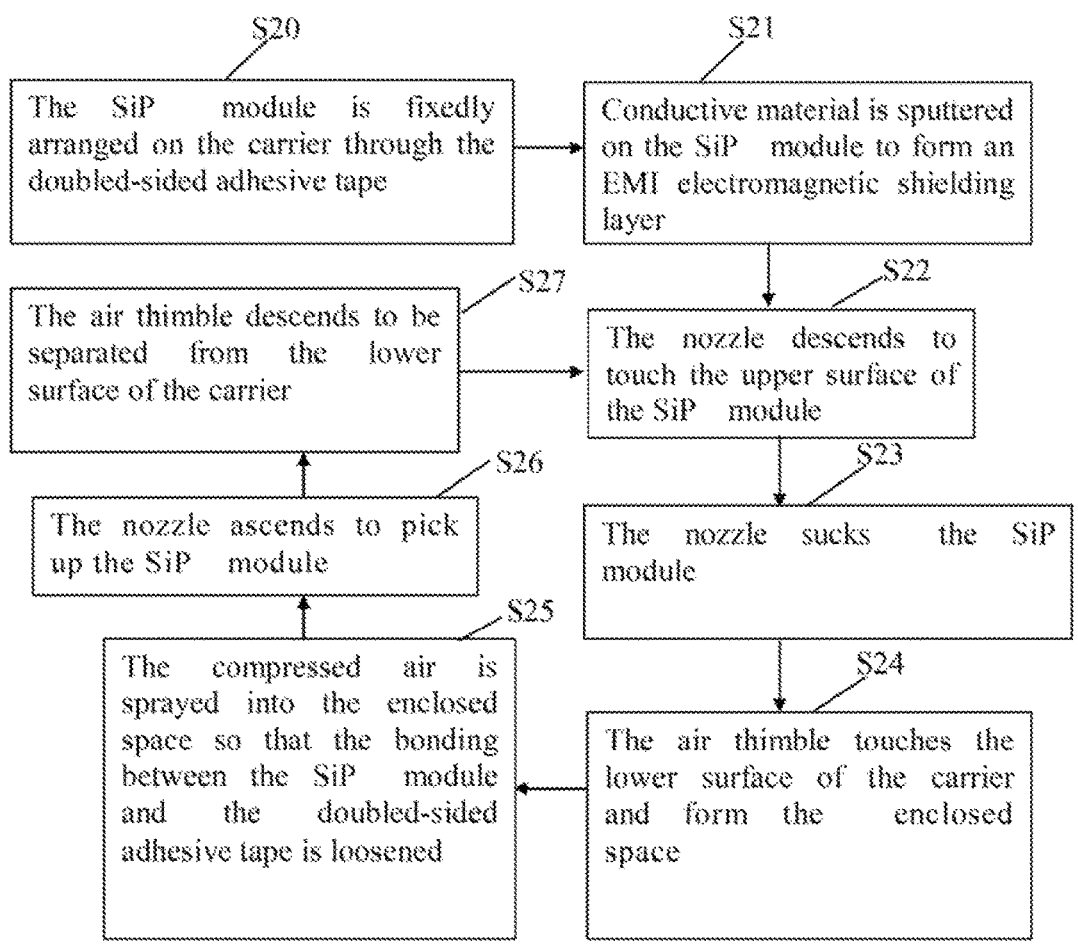
FIG. 2 is the flowchart for the EMI electromagnetic shielding layer manufacturing method of the SiP module in the specific embodiment.
Figure 3:
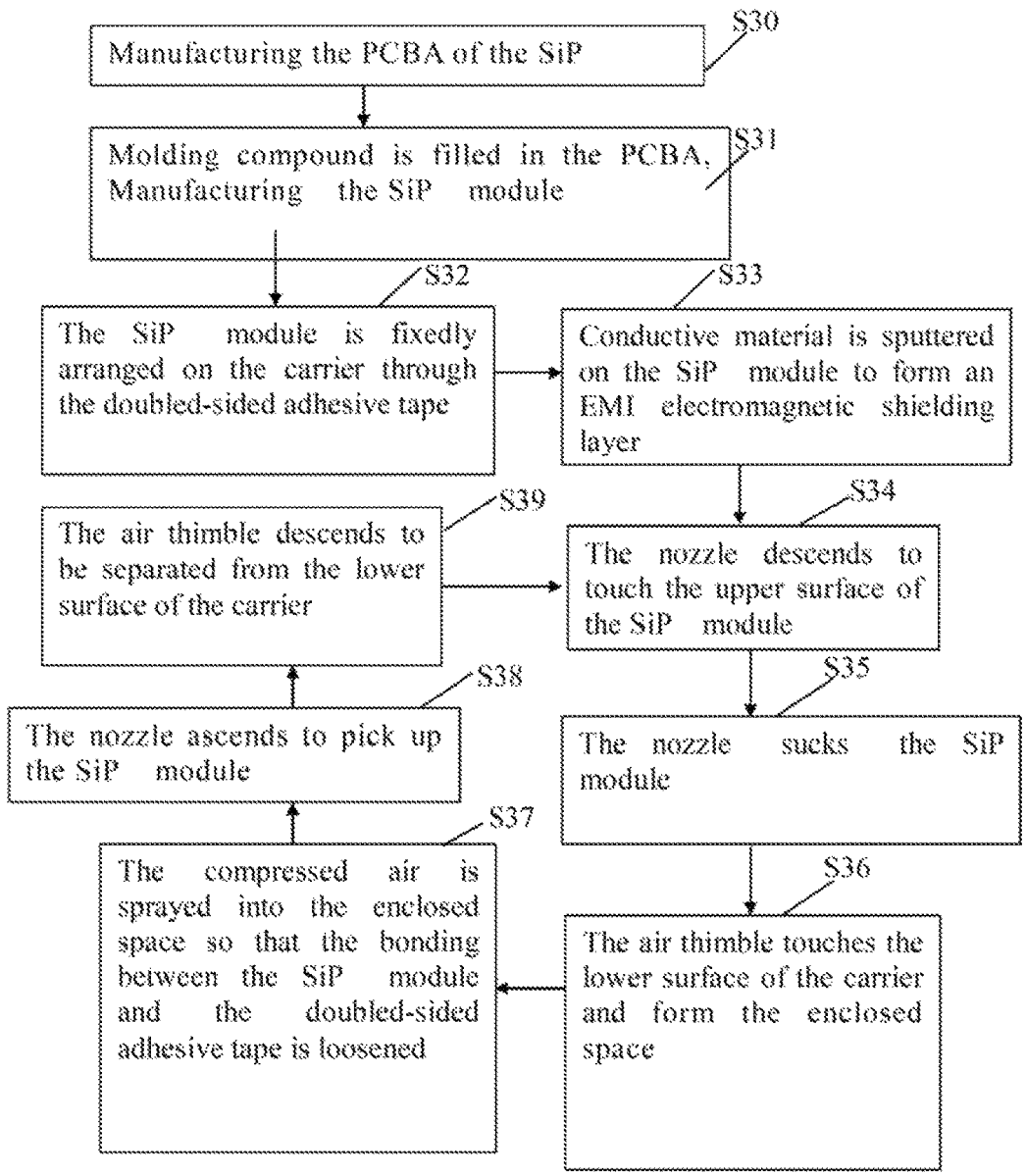
FIG. 3 is the flowchart for the manufacturing method of the SiP module in the specific embodiment.
Figure 4:
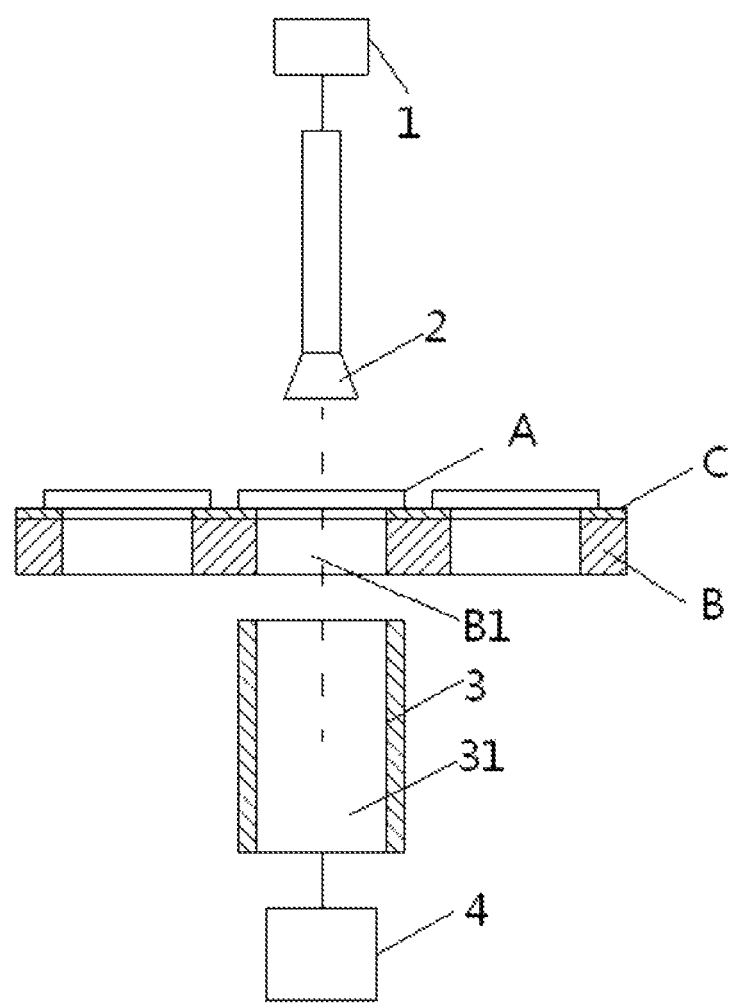
FIG. 4 is the structural diagram of the specific embodiment 1 of the pickup equipment of the SiP module.
Figure 5:
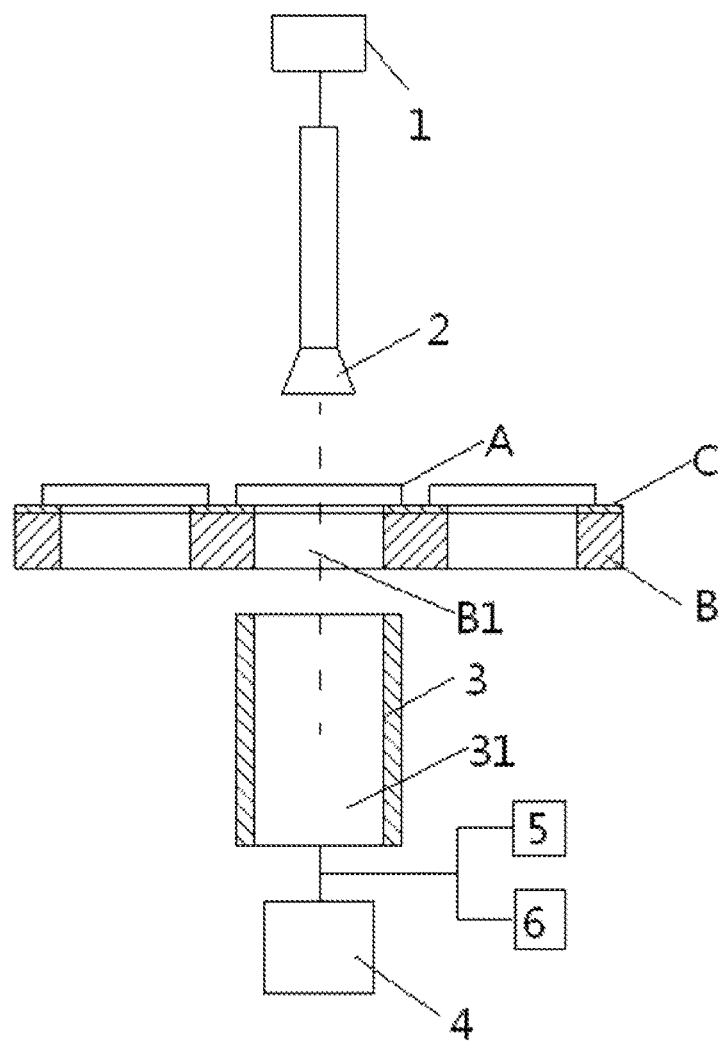
FIG. 5 is the structural diagram of the specific embodiment 2 of the pickup equipment of the SiP module.
Figure 6:
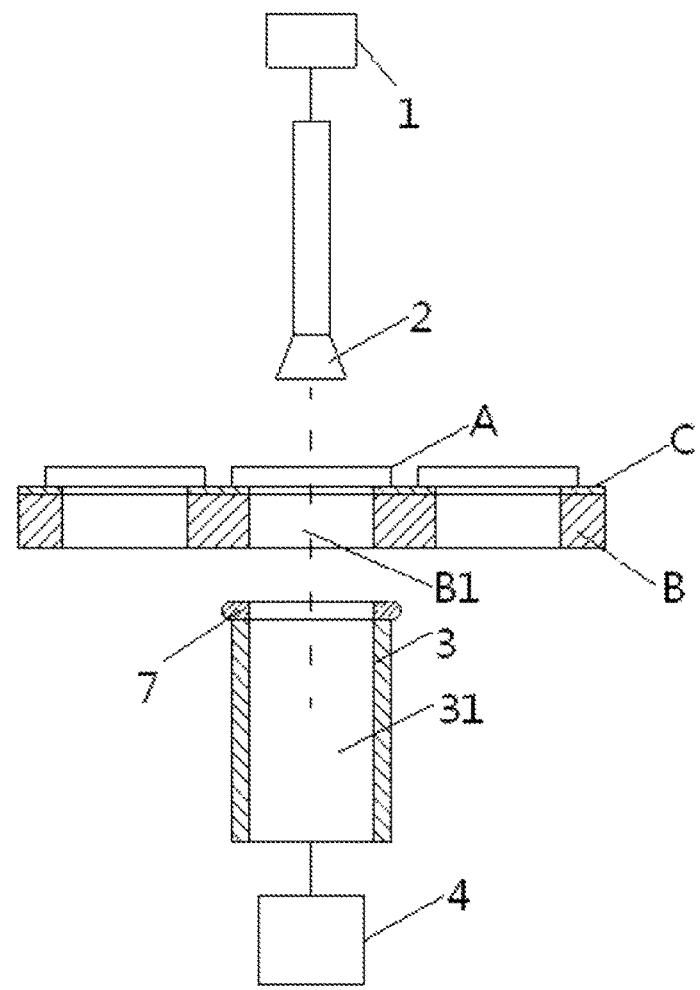
FIG. 6 is the structural diagram of the specific embodiment 3 of the pickup equipment of the SIP module.
Figure 7:
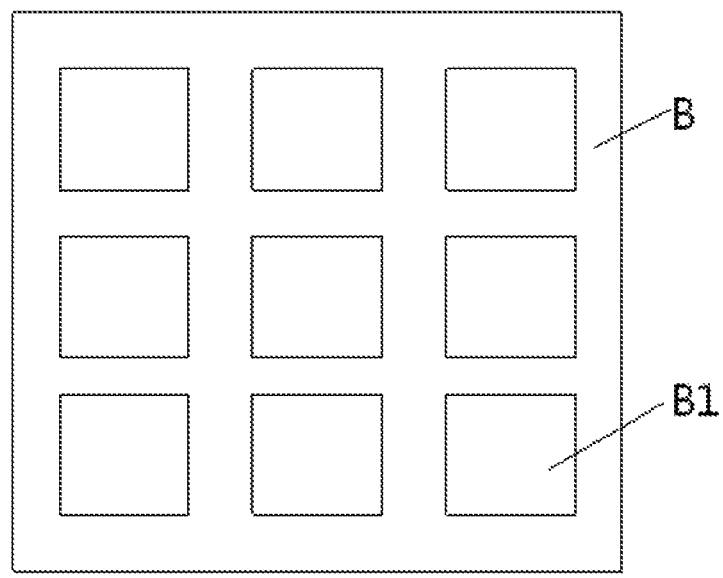
FIG. 7 is the vertical view of the carrier.

| Brief Description of the Drawing Numbers: | | |
| --- | --- | --- |
| A SiP module | B Carrier | B1 Through hole |
| C Doubled-sided adhesive tape | 1 Robotic arm | 2 Nozzle |
| 3 Air thimble | 31 Hollow structure | 4 Air thimble moving mechanism |
| 5 Electromagnetic valve | 6 Cylinder | 7 O-shaped ring. |

DETAILED DESCRIPTION OF THE INVENTION

In order to more dearly describe the examples of the invention, below is the brief introduction to the drawings required in the description of the examples. Obviously, the drawings in the following description are only some examples of the invention. Ordinary technicians in the field can also obtain other drawings according to the drawings on the premise of not doing any creative work.

Drawing 1 is the flowchart for the pickup method of the SiP module in the specific embodiment; as shown in Drawing 1, the specific example discloses the pickup method of the SiP module, which picks up the SiP module fixed on the upper surface of the carrier through the doubled-sided adhesive tape, and is characterized by and comprises the following steps:

Step S10: The nozzle descends to touch the upper surface of the SiP module;

Step S11: The nozzle sucks the SiP module with suction;

Step S12: The air thimble ascends to touch the lower surface of the carrier; the air thimble covers the through hole of the carrier, so as to form the enclosed space for the lower surface of the SiP module, the through hole and the air thimble;

Step S13: The compressed air is sprayed into the enclosed space from the hollow structure of the air thimble and acts on the lower surface of the SiP module, so that the bonding between the SiP module and the doubled-sided adhesive tape is loosened;

Step S14: The nozzle ascends to pick up the SiP module.

Specifically, the pickup method in the example also comprises Step S15: the air thimble descends to be separated from the lower surface of the carrier.

In the example, in order to achieve the better pickup effect, the pressure of the sprayed compressed air is higher than or equal to the bonding force of the doubled-sided adhesive tape, or the pressure of the sprayed compressed air is smaller than the bonding force of the doubled-sided adhesive tape, so as to make the rest bonding force between the SiP module and the doubled-sided adhesive tape which is loosened is smaller than the suction force of the nozzle.

Wherein the rest bonding force means the bonding force between the SiP module and the doubled-sided adhesive tape after compressed air is sprayed into the enclosed space from the hollow structure of the air thimble and acts on the lower surface of the SiP module.

Wherein, that the pressure of the sprayed compressed air makes the rest bonding force between the SiP module and the doubled-sided adhesive tape which is loosened is smaller than the suction force of the nozzle means:

Rest bonding force<suction force;

Rest bonding force+weight of the chips<=suction force;

Rest bonding force<=suction force−weight of the chips.

What needs to be described is that in other embodiments, the pressure of the compressed air which is sprayed by the air thimble can be set according to the actual need, as long as the bonding between the SIP module and the doubled-sided adhesive tape becomes loosened.

Drawing 2 is the flowchart for the EMI electromagnetic shielding layer manufacturing method of the SiP module in the specific embodiment; as shown in Drawing 2, the EMI electromagnetic shielding layer manufacturing method of the SiP module comprises:

Step S20: The SiP module is fixedly arranged on the upper surface of the carrier with the through hole through the doubled-sided adhesive tape, the lower surface of the SiP module is a surface, which is provided with the welding pads, and the welding pads are right above the through hole and do not touch the doubled-sided adhesive tape;

Step S21: Conductive material is sputtered around and on the upper surface of the SiP module to form an EMI electromagnetic shielding layer;

Step S22: The nozzle descends to touch the upper surface of the SiP module;

Step S23: The nozzle sucks the SiP module;

Step S24: The air thimble ascends to touch the lower surface of the carrier; the air thimble covers the through hole of the carrier, so as to form the enclosed space for the lower surface of the SiP module, the through hole and the air thimble;

Step S25: Compressed air is sprayed into the enclosed space from the hollow structure of the air thimble and acts on the lower surface of the SiP module, so that the bonding between the SiP module and the doubled-sided adhesive tape is loosened;

Step S26: The nozzle ascends to pick up the manufactured SiP module with EMI electromagnetic shielding layers on the upper surface and around and without pollution or damage on the lower surface.

In the example, in order to achieve the better pickup effect, the pressure of the sprayed compressed air is higher than or equal to the bonding force of the doubled-sided adhesive tape, or the pressure of the sprayed compressed air is smaller than the bonding force of the doubled-sided adhesive tape, so as to make the rest bonding force between the SiP module and the doubled-sided adhesive tape which is loosened is smaller than the suction force of the nozzle. Wherein the rest bonding force means the bonding force between the SiP module and the doubled-sided adhesive tape after compressed air is sprayed into the enclosed space from the hollow structure of the air thimble and acts on the lower surface of the SiP module.

What needs to be described is that in other examples, the pressure of the compressed air which is sprayed by the air thimble can be set according to the actual need, as long as the bonding between the SiP module and the doubled-sided adhesive tape becomes loosened.

Specifically, the EMI electromagnetic shielding layer manufacturing method of the SiP module also comprises the following steps S27: the air thimble descends to be separated from the lower surface of the carrier.

Drawing 3 is the flowchart for the manufacturing method of the SiP module in the specific embodiment; as shown in Drawing 3, the manufacturing method of the SiP module comprises the following steps:

Step S30: Chips, active components and passive components required for the SiP module are welded on the upper surface of a PCB (printed circuit board), welding pads are pre-reserved on the lower surface of the PCB, and the PCBA of the SiP module is manufactured;

Step S31: Molding compound is filled in the PCBA, so that the molding compound covers the chips, active components and passive components on the upper surface of the PCBA, the molding compound is solidified and the SiP module is manufactured;

Step S32: The SiP module is fixedly arranged on the upper surface of the carrier with the through hole through the doubled-sided adhesive tape, the lower surface of the SiP module is a surface, which is provided with the welding pads, and the welding pads are right above the through hole and do not touch the doubled-sided adhesive tape;

Step S33: Conductive material is sputtered around and on the upper surface of the SiP module to form an EMI electromagnetic shielding layer;

Step S34: The nozzle descends to touch the upper surface of the SiP module;

Step S35: The nozzle sucks the SiP module;

Step S36: The air thimble ascends to touch the lower surface of the carrier; the air thimble covers the through hole of the carrier, so as to form the enclosed space for the lower surface of the SiP module, the through hole and the air thimble;

Step S37: Compressed air is sprayed into the enclosed space from the hollow structure of the air thimble and acts on the lower surface of the SiP module, so that the bonding between the SiP module and the doubled-sided adhesive tape is loosened;

Step S38: The nozzle ascends to pick up the manufactured SiP module without pollution or damage on the lower surface.

In the example, in order to achieve the better pickup effect, the pressure of the sprayed compressed air is higher than or equal to the bonding force of the doubled-sided adhesive tape, or the pressure of the sprayed compressed air is smaller than the bonding force of the doubled-sided adhesive tape, so as to make the rest bonding force between the SiP module and the doubled-sided adhesive tape which is loosened is smaller than the suction force of the nozzle. Wherein the rest bonding force means the bonding force between the SiP module and the doubled-sided adhesive tape after compressed air is sprayed into the enclosed space from the hollow structure of the air thimble and acts on the lower surface of the SiP module.

What needs to be described is that in other examples, the pressure of the compressed air which is sprayed by the air thimble can be set according to the actual need, as long as the bonding between the SiP module and the doubled-sided adhesive tape becomes loosened.

Specifically, the manufacturing method of the SiP module also comprises Step S39: the air thimble descends to be separated from the lower surface of the carrier.

In the specific embodiment, the PCB, the PCBA and SiP module which is manufactured through the solidification of molding compound are respectively the strip PCB, the strip PCBA and the strip SiP module. In addition, the strip SiP module is cut into single unit of SiP module before conductive material sputtering.

The invention also provides the pickup equipment of the SiP module, which is used for picking up the SiP module which is fixed on the upper surface of the carrier through the doubled-sided adhesive tape.

Drawing 4 is the structural diagram of the specific embodiment 1 of the pickup equipment of the SiP module; as shown in Drawing 4, in the specific embodiment 1, the pickup equipment of the SiP module comprises the nozzle 2, the robotic arm 1, the air thimble 3 and the air thimble moving mechanism 4; the nozzle 2 is arranged above the carrier B and is used for having suction force on the upper surface of the SiP module A and picking up the SiP module A; the robotic arm 1 is connected with the nozzle 2, and is used for moving the nozzle 2; the air thimble 3 is arranged below the carrier B and a hollow structure 31 for the compressed air to pass through is arranged in the middle of the air thimble and is used for spraying the compressed air; the air thimble moving mechanism 4 is connected with the air thimble 3, and is used for making the air thimble 3 right to the through hole B1 of the carrier B; the air thimble moving mechanism 4 is also used for making the air thimble 3 ascend and descend to touch and be separated from the lower surface of the carrier B.

Again referring to Drawing 4, when the air thimble moving mechanism 4 ascends to touch the lower surface of the carrier B, the air thimble 3 covers the through hole B1 of the carrier B, so as to form the enclosed space for the lower surface of the SiP module, the through hole B1 and the air thimble 3; the compressed air is sprayed into the enclosed space from the hollow structure 31 of the air thimble 3 and acts on the lower surface of the SiP module A, so that the bonding between the SiP module A and the doubled-sided adhesive tape C is loosened; the nozzle 2 sucks, ascends and picks up the SiP module A.

From Drawing 4 we can see that the contact area between the doubled-sided adhesive tape C and the carrier B is larger than that between the doubled-sided adhesive tape C and the SiP module A. Therefore, the bonding force between the SiP module A and the doubled-sided adhesive tape C is smaller than that between the carrier B and the doubled-sided adhesive tape C. When the compressed air is sprayed, the bonding of the contact surface between the doubled-sided adhesive tape C and the SiP module A is loosened earlier than that of the contact surface between the doubled-sided adhesive tape C and the carrier B.

Drawing 5 is the structural diagram of the specific embodiment 2 of the pickup equipment of the SiP module. The structure of the embodiment is same with that as shown in Drawing 4, and the difference only lies in that the pickup equipment of the SiP module of this embodiment further comprises the electromagnetic valve 5 and the cylinder 6; the cylinder 6 is connected with the air thimble 3, and is used for supplying compressed air to the air thimble 3; the electromagnetic valve 5 is arranged between the cylinder 6 and the air thimble 3, and is used for controlling the cylinder 6 to spray the compressed air.

Again referring to Drawing 5, when the air thimble moving mechanism 4 ascends to touch the lower surface of the carrier B, the air thimble 3 covers the through hole B1 of the carrier B, so as to form the enclosed space for the lower surface of the SiP module, the through hole B1 and the air thimble 3; the electromagnetic valve 5 controls the cylinder 6, the cylinder 6 sprays compressed air to enclosed space through the hollow structure 31 of the air thimble 3 and act on the lower surface of the SiP module A, so that the bonding between the SiP module A and the doubled-sided adhesive tape C is loosened; the nozzle 2 sucks, ascends and picks up the SiP module A.

Drawing 6 is the structural diagram of the specific embodiment 3 of the pickup equipment of the SiP module. The difference of embodiment 3 from that as shown in Drawing 4 only lies in that the air thimble 3 is also provided with the O-shaped ring 7; when the air thimble 3 ascends, the O-shaped ring 7 touches the lower surface of the carrier B. Specifically, the shape and the size of the air thimble 3 are enough to cover the through hole of the carrier B means that the size of the O-shaped ring is equal to or bigger than that of the through hole B1 and is enough to cover and seal the bottom of the through hole B1. More specifically, the O-shaped ring 7 is made of rubber.

Again referring to Drawing 6, when the air thimble moving mechanism 4 ascends to touch the lower surface of the carrier B, the air thimble 3 covers the through hole B1 of the carrier B, so as to form the enclosed space for the lower surface of the SiP module, the through hole B1 and the air thimble 3; the compressed air is sprayed into the enclosed space from the hollow structure 31 of the air thimble 3 and acts on the lower surface of the SiP module A, so that the bonding between the SiP module A and the doubled-sided adhesive tape C is loosened; the nozzle 2 sucks, ascends and picks up the SiP module A.

In the three examples of the pickup equipment of the said SiP module, in order to achieve the better pickup effect, the pressure of the sprayed compressed air is higher than or equal to the bonding force of the doubled-sided adhesive tape, or the pressure of the sprayed compressed air is smaller than the bonding force of the doubled-sided adhesive tape, so as to make the rest bonding force between the SiP module and the doubled-sided adhesive tape which is loosened is smaller than the suction force of the nozzle. Wherein the rest bonding force means the bonding force between the SiP module and the doubled-sided adhesive tape after compressed air is sprayed into the enclosed space from the hollow structure of the air thimble and acts on the lower surface of the SiP module.

Specifically, the pickup equipment of the SiP module also comprises the carrier transmission mechanism (not shown); the carrier transmission mechanism is connected with the carrier, and is used for moving the carrier. Specifically, a pulse electromagnetic valve is preferable.

Drawing 7 is the vertical view of the carrier. As shown in Drawing 7, in the said embodiment, the doubled-sided adhesive tapes are fully distributed on the whole carrier B, and the doubled-sided adhesive tape which is arranged above the through hole B1 of the carrier B is also provided with the corresponding through hole. What needs to be described is that the size of the through hole on the doubled-sided adhesive tape can be a little bigger than or smaller than that of the through hole on the carrier, but the size of the SiP module needs to be bigger than that of the through hole on the doubled-sided adhesive tape.

The said embodiments are only preferable embodiments of the invention. What needs to be pointed out is that ordinary technicians in the technical field can make further improvement and coloring on the premise of not deviating from the principle of the invention, and such improvement and coloring shall also be considered as within the protection scope of the invention.

What is claimed is:

1. A method for picking up the SiP module which is fixed on the upper surface of a carrier by a doubled-sided adhesive tape, and comprises the following steps:
   a nozzle descends to touch the upper surface of the SiP module;
   the nozzle sucks the SiP module;
   an air thimble ascends to touch the lower surface of the carrier; the air thimble covers the through hole of the carrier, so as to form the enclosed space for the lower surface of the SiP module, the through hole and the air thimble;
   compressed air is sprayed into the enclosed space from the hollow structure of the air thimble and acts on the lower surface of the SiP module, so that the bonding between the SiP module and the doubled-sided adhesive tape is loosened;
   the nozzle ascends and picks up the SIP module.

2. The method for picking up the SiP module according to claim 1, wherein, the pressure of the sprayed compressed air is higher than or equal to the bonding force of the doubled-sided adhesive tape.

3. The method for picking up the SiP module according to claim 2, further comprises the following steps: the air thimble descends to be separated from the lower surface of the carrier.

4. The method for picking up the SiP module according to claim 1, wherein, the pressure of the sprayed compressed air is smaller than the bonding force of the doubled-sided adhesive tape, so as to make the rest bonding force between the SiP module and the doubled-sided adhesive tape which is loosened is smaller than the suction force of the nozzle.

5. The method for picking up the SiP module according to claim 4, further comprises the following steps: the air thimble descends to be separated from the lower surface of the carrier.

6. The method for picking up the SiP module according to claim 1, further comprises the following steps: the air thimble descends to be separated from the lower surface of the carrier.

7. A EMI electromagnetic shielding layer manufacturing method of the SiP module, and comprises the following steps:
   the SiP module is fixedly arranged on the upper surface of the carrier with the through hole through the doubled-sided adhesive tape, the lower surface of the SiP module is a surface, which is provided with the welding pads, and the welding pads are right above the through hole and do not touch the doubled-sided adhesive tape;
   conductive material is sputtered around and on the upper surface of the SIP module to form an EMI electromagnetic shielding layer;
   the nozzle descends to touch the upper surface of the SiP module, and sucks the SiP module;
   the air thimble ascends to touch the lower surface of the carrier; the air thimble covers the through hole of the carrier, so as to form the enclosed space for the lower surface of the SiP module, the through hole and the air thimble;
   compressed air is sprayed into the enclosed space from the hollow structure of the air thimble and acts on the lower surface of the SiP module, so that the bonding between the SiP module and the doubled-sided adhesive tape is loosened;
   the nozzle ascends to pick up the manufactured SiP module with EMI electromagnetic shielding layers on the upper surface and around and without pollution or damage on the lower surface.

8. The EMI electromagnetic shielding layer manufacturing method of the SIP module according to claim 7, wherein, the pressure of the sprayed compressed air is higher than or equal to the bonding force of the doubled-sided adhesive tape.

9. The EMI electromagnetic shielding layer manufacturing method of the SiP module according to claim 7, wherein, the pressure of the sprayed compressed air is smaller than the bonding force of the doubled-sided adhesive tape, so as to make the rest bonding force between the SIP module and the doubled-sided adhesive tape which is loosened is smaller than the suction force of the nozzle.

10. The EMI electromagnetic shielding layer manufacturing method of the SiP module according to claim 9, further comprises the following steps: the air thimble descends to be separated from the lower surface of the carrier.

11. The EMI electromagnetic shielding layer manufacturing method of the SiP module according to claim 7, further comprises the following steps: the air thimble descends to be separated from the lower surface of the carrier.

12. A manufacturing method of the SIP module, and the method comprises the following steps:
   chips, active components and passive components required for the SiP module are welded on the upper surface of a PCB (printed circuit board), welding pads are pre-reserved on the lower surface of the PCB, and the PCBA (printed circuit board assembly) of the SiP module is manufactured;
   molding compound is filled in the PCBA, so that the molding compound covers the chips, active components and passive components on the upper surface of the PCBA, the molding compound is solidified and the SiP module is manufactured;
   the SiP module is fixedly arranged on the upper surface of the carrier with the through hole through the doubled-sided adhesive tape, the lower surface of the SiP module is a surface, which is provided with the welding pads, and the welding pads are right above the through hole and do not touch the doubled-sided adhesive tape;
   conductive material is sputtered around and on the upper surface of the SiP module to form an EMI electromagnetic shielding layer;
   the nozzle descends to touch the upper surface of the SiP module, and sucks the SiP module;
   the air thimble ascends to touch the lower surface of the carrier; the air thimble covers the through hole of the carrier, so as to form the enclosed space for the lower surface of the SiP module, the through hole and the air thimble;
   compressed air is sprayed into the enclosed space from the hollow structure of the air thimble and acts on the lower surface of the SiP module, so that the bonding between the SiP module and the doubled-sided adhesive tape is loosened;
   the nozzle ascends to pick up the manufactured SiP module without pollution or damage on the lower surface.

13. The manufacturing method of the SIP module according to claim 12, wherein, the pressure of the sprayed compressed air is higher than or equal to the bonding force of the doubled-sided adhesive tape.

14. The manufacturing method of the SiP module according to claim 13, further comprises the following step: the air thimble descends to be separated from the lower surface of the carrier.

15. The manufacturing method of the SiP module according to claim 12, wherein, the pressure of the sprayed compressed air is smaller than the bonding force of the doubled-sided adhesive tape, so as to make the rest bonding force between the SiP module and the doubled-sided adhesive tape which is loosened is smaller than the suction force of the nozzle.

16. The manufacturing method of the SiP module according to claim 15, further comprises the following step: the air thimble descends to be separated from the lower surface of the carrier.

17. The manufacturing method of the SiP module according to claim 12, further comprises the following step: the air thimble descends to be separated from the lower surface of the carrier.

18. The manufacturing method of the SiP module according to claim 12, wherein, the PCB, the PCBA and the SiP module which is manufactured through the solidification of molding compound are respectively a strip PCB, a strip PCBA and a strip SiP module; the strip SiP module is cut into single unit of SP module before conductive material sputtering.

* * * * *